United States Patent
Xuan

(10) Patent No.: US 11,839,063 B2
(45) Date of Patent: Dec. 5, 2023

(54) REFRIGERATION DEVICE AND DATA CENTER

(71) Applicant: Huawei Digital Power Technologies Co., Ltd., Shenzhen (CN)

(72) Inventor: Qi Xuan, Dongguan (CN)

(73) Assignee: HUAWEI DIGITIAL POWER TECHNOLOGIES CO., LTD., Shenzhen (CN)

( * ) Notice: Subject to any disclaimer, the term of this patent is extended or adjusted under 35 U.S.C. 154(b) by 146 days.

(21) Appl. No.: 17/570,955

(22) Filed: Jan. 7, 2022

(65) Prior Publication Data

US 2022/0225544 A1 Jul. 14, 2022

(30) Foreign Application Priority Data

Jan. 11, 2021 (CN) .......................... 202110032035.3

(51) Int. Cl.
*H05K 7/20* (2006.01)

(52) U.S. Cl.
CPC ..... *H05K 7/20827* (2013.01); *H05K 7/20309* (2013.01); *H05K 7/20318* (2013.01); *H05K 7/20327* (2013.01)

(58) Field of Classification Search
CPC ........... H05K 7/20827; H05K 7/20745; H05K 7/20327; F24F 1/0317
See application file for complete search history.

(56) References Cited

U.S. PATENT DOCUMENTS

| | | | |
|---|---|---|---|
| 4,907,546 | A | 3/1990 | Ishii et al. |
| 5,277,039 | A | 1/1994 | Haasis |
| 2004/0020226 | A1 | 2/2004 | Bash et al. |
| 2016/0105994 | A1 | 4/2016 | Hwang |
| 2020/0281099 | A1 | 9/2020 | Klaba et al. |

FOREIGN PATENT DOCUMENTS

| | | |
|---|---|---|
| CN | 204994117 U | 1/2016 |
| CN | 106016470 A | 10/2016 |
| CN | 108990382 A | 12/2018 |
| CN | 208952354 U | 6/2019 |
| CN | 209072826 U | 7/2019 |
| CN | 110785057 A | 2/2020 |
| CN | 110838687 A | 2/2020 |
| CN | 210568972 U | 5/2020 |
| EP | 2532217 B1 | 11/2013 |
| JP | 2001124457 A | 5/2001 |
| JP | 2004023036 A | 1/2004 |
| WO | 2020126548 A1 | 6/2020 |

*Primary Examiner* — Lionel Nouketcha
(74) *Attorney, Agent, or Firm* — Conley Rose, P.C.

(57) ABSTRACT

A refrigeration device includes an indoor unit and an outdoor unit. The indoor unit is used for heat exchange with air inside an equipment room. To adapt to different cabinets, one or more ventilation ducts of the indoor unit include a plurality of channels, and a baffle assembly is disposed in the indoor unit. An air flow direction in the ventilation duct is changed using the baffle assembly, and the baffle assembly is adjusted to block different positions to apply the refrigeration device to different types of cabinets.

20 Claims, 10 Drawing Sheets

REFRIGERATION DEVICE AND DATA CENTER

CROSS-REFERENCE TO RELATED APPLICATION

This claims priority to Chinese Patent Application No. 202110032035.3 filed on Jan. 11, 2021, which is hereby incorporated by reference in its entirety.

TECHNICAL FIELD

This disclosure relates to the field of refrigeration technologies, and in particular, to a refrigeration device and a data center.

BACKGROUND

Rapid development of fifth generation (5G) and edge computing brings along a burst of deployment of edge node equipment rooms. Devices in edge node equipment rooms cover fields such as access, transmission, and data communication. Cabinet forms vary from one another, for example, a side-exhaust cabinet and a top-exhaust cabinet, leading to different air duct types. In addition, power consumption of cabinets is further increased compared with that in the past, and a thermal design of equipment rooms faces many challenges. A current equipment room constructor usually adopts a solution of an external integrated refrigeration device or a room-level split refrigeration device. For example, FIG. 1 is a schematic application diagram of refrigeration devices in conventional technologies. Cabinets 3 are disposed side by side in an equipment room 2. A refrigeration device 1 is fixed to a side wall of the equipment room 2, and a refrigeration device 2 uses a side-supply side-return air duct form. Therefore, the refrigeration devices are adapted to only a top-exhaust cabinet during air supply, while a problem of compatibility with a side-exhaust cabinet still exists. In an equipment room in the conventional technologies, there are cabinets with different hot air exhausting manners. Therefore, adaptability of the refrigeration device 1 is comparatively poor, affecting normal use of the edge node equipment room.

SUMMARY

This disclosure provides a refrigeration device and a data center, to adapt to heat dissipation of different types of cabinets.

According to a first aspect, a refrigeration device is provided. The refrigeration device is configured to adapt to different heat dissipation requirements of cabinets in a data center. The refrigeration device includes an indoor unit and an outdoor unit. The indoor unit is used for heat exchange with air inside an equipment room. The outdoor unit is used for heat exchange with the indoor unit, to transfer heat inside the equipment room to the outside. Existing cabinets include top-exhaust or side-exhaust cabinets. To adapt to different cabinets, ventilation ducts of the indoor unit in this disclosure are improved. The indoor unit includes a first ventilation duct and a second ventilation duct that are arranged along a direction leaving the top of a cabinet. The first ventilation duct and the second ventilation duct communicate with each other through a first ventilation opening. The indoor unit further includes a first evaporation assembly disposed in the first ventilation duct and a second evaporation assembly disposed in the second ventilation duct. The first evaporation assembly and the second evaporation assembly are respectively disposed on two sides of the first ventilation opening. The indoor unit further includes a baffle assembly for adjusting air intake directions of the first ventilation duct and the second ventilation duct. The baffle assembly is configured to adjust ventilation manners of the first ventilation duct and the second ventilation duct. For example, in a first state, the baffle assembly separates the first ventilation duct from the second ventilation duct, and adjusts the first ventilation duct and the second ventilation duct to supply air in a same direction. In this case, the refrigeration device is applicable to a side-exhaust cabinet. In a second state, the baffle assembly adjusts the first ventilation duct and the second ventilation duct to separately let in air from the middles, and the first ventilation duct and the second ventilation duct to supply air in opposite directions. In this case, the refrigeration device is applicable to a top-exhaust cabinet. To dissipate heat for the first evaporation assembly and the second evaporation assembly, the outdoor unit includes a condenser that performs heat exchange with each of the first evaporation assembly and the second evaporation assembly separately. In the foregoing technical solution, the ventilation ducts of the refrigeration device are reconfigured, and the baffle assembly is disposed to change an air intake manner of the ventilation duct, so that the refrigeration device can be applied to cabinets of different hot air exhausting types, thereby improving universality of the refrigeration device.

In a specific implementable solution, the indoor unit further includes a third ventilation duct. The third ventilation duct penetrates the first ventilation duct and the second ventilation duct and connects the first ventilation duct to the second ventilation duct. The first ventilation opening is located in the third ventilation duct. An air intake vent of the third ventilation duct is close to the second ventilation duct. The first ventilation duct is divided into a first subchannel and a second subchannel by the third ventilation duct. The second ventilation duct is divided into a third subchannel and a fourth subchannel by the third ventilation duct. The first subchannel and the fourth subchannel are respectively located on two sides of the third ventilation duct. The first evaporation assembly is located in the first subchannel, and the second evaporation assembly is located in the second subchannel. In the first state, the baffle assembly connects the first subchannel to the second subchannel, connects the second subchannel to the fourth subchannel, and blocks the air intake vent of the third ventilation duct. In the second state, the baffle assembly connects each of the first subchannel and the fourth subchannel to the third ventilation duct, and separates each of the second subchannel and the third subchannel from the third ventilation duct. In addition, the first subchannel and the fourth subchannel both let in air through the third ventilation duct. Through cooperation between the disposed third ventilation duct and the baffle assembly, a ventilation manner of the indoor unit is adjusted, to adapt to different cabinets.

In a specific implementable solution, the indoor unit further includes a housing with two ends having openings. A partition board is disposed in the housing, and a cavity in the housing is divided into the first ventilation duct and the second ventilation duct by the partition board. A second ventilation opening is disposed on a first side wall that is of the housing and that faces the cabinet. The first ventilation opening is disposed on the partition board. The second ventilation opening and the first ventilation opening communicate with each other and are located in the third ventilation duct. The second ventilation opening is the air intake vent of the third ventilation duct. The ventilation duct is formed by using the housing and the partition board.

In a specific implementable solution, the housing and the partition board may be of an integrated structure. This enhances structural strength of the indoor unit.

In a specific implementable solution, the baffle assembly includes a first baffle, a second baffle, and a third baffle. The first baffle and the second baffle are separately connected to the partition board in a rotatable manner. The third baffle is connected to the first side wall and is configured to block the second ventilation opening. In the first state, the first baffle rotates to a first specified position, the second baffle rotates to a second specified position, the first baffle and the second baffle block the first ventilation opening, the first subchannel is connected to the second subchannel, the third subchannel is connected to the fourth subchannel, and the third baffle blocks the second ventilation opening. In the second state, the first baffle rotates to a third specified position, the first baffle separates the third subchannel from the third ventilation duct, the second baffle rotates to a fourth specified position, the second baffle separates the second subchannel from the third ventilation duct, and the third baffle unblocks the second ventilation opening, so that the second ventilation opening is open. A ventilation manner of the ventilation duct is changed by using the disposed first baffle, second baffle, and third baffle.

In a specific implementable solution, the baffle assembly further includes a first driving mechanism for driving the first baffle to rotate and be locked in the first specified position or the third specified position, and a second driving mechanism for driving the second baffle to rotate and be locked in the second specified position or the fourth specified position. In this way, the first baffle and the second baffle are controlled.

In a specific implementable solution, both the first driving mechanism and the second driving mechanism are stepper motors.

In a specific implementable solution, the third baffle is connected to the first side wall in a slidable manner. In addition, in the first state, the third baffle slides to a seventh specified position. The third baffle is connected to the first side wall in a slidable manner. In addition, in the first state, the third baffle slides to a fifth specified position, and the third baffle blocks the second ventilation opening, and in the second state, the third baffle slides to a sixth specified position, and the second ventilation opening is open. The third baffle is connected to the first side wall in the slidable manner, so as to unblock or block the second ventilation opening.

In a specific implementable solution, the baffle assembly further includes a third driving mechanism for driving the third baffle to slide and be locked in the fifth specified position or the sixth specified position. The third driving mechanism is used, so that the third baffle is driven to slide and be locked.

In a specific implementable solution, the third driving mechanism includes a motor and a transmission assembly, and the transmission assembly may be a lead screw assembly, a gear rack assembly, a transmission belt assembly, or the like.

In a specific implementable solution, the third baffle is connected to the first side wall in a rotatable manner. In addition, in the first state, the third baffle rotates to a seventh specified position, and the third baffle blocks the second ventilation opening, and in the second state, the third baffle rotates to an eighth specified position, and the second ventilation opening is open. The third baffle rotates relative to the first side wall, to unblock or block the second ventilation opening.

In a specific implementable solution, the first evaporation assembly includes a first evaporator and a first fan that are disposed side by side, and the second evaporation assembly includes a second evaporator and a second fan that are disposed side by side. An air supply effect is improved by using the fan.

In a specific implementable solution, the first fan may be located on different sides of the first evaporator, and the second fan may be located on different sides of the second evaporator.

In a specific implementable solution, the refrigeration device further includes a controller. In the first state, the controller controls the first fan and the second fan to separately supply air in a same direction. In the second state, the controller controls the first fan and the second fan to supply air in opposite directions. Air supply directions of the first fan and the second fan are controlled by using the controller.

According to a second aspect, a data center is provided. The data center includes an equipment room and cabinets disposed in the equipment room, and further includes the refrigeration device configured to dissipate heat for the cabinets according to any one of the foregoing solutions. The refrigeration device is disposed on the top of the equipment room, and is located above the cabinets. In the foregoing technical solution, ventilation ducts of the refrigeration device are reconfigured, and a baffle assembly is disposed to change an air intake manner of the ventilation duct, so that the refrigeration device can be applied to cabinets of different hot air exhausting types, thereby improving universality of the refrigeration device.

In a specific implementable solution, the cabinet is a side-intake top-exhaust cabinet, two of the cabinets are disposed side by side, and air intake sides of the two cabinets are disposed oppositely, and the baffle assembly is in a second state, a first ventilation duct and a second ventilation duct let in air from the middles, and an air intake direction of the first ventilation duct faces the tops of the two cabinets.

In a specific implementable solution, the cabinet is a cabinet that lets in cold air from one side and exhausts hot air from another side, the cabinets are disposed in a single row, and the baffle assembly is in a first state, a ventilation direction of the first ventilation duct is the same as that of the second ventilation duct, and the ventilation direction of the first ventilation duct is the same as that of the cabinet.

DESCRIPTION OF EMBODIMENTS

For ease of understanding a refrigeration device provided in embodiments of this disclosure, an application scenario of the refrigeration device provided in the embodiments of this disclosure is first described. The refrigeration device provided in the embodiments of this disclosure is applied to heat dissipation of a cabinet in an equipment room. Based on ventilation manners, cabinets may be classified into top-exhaust cabinets and side-exhaust cabinets.

Figure 1:
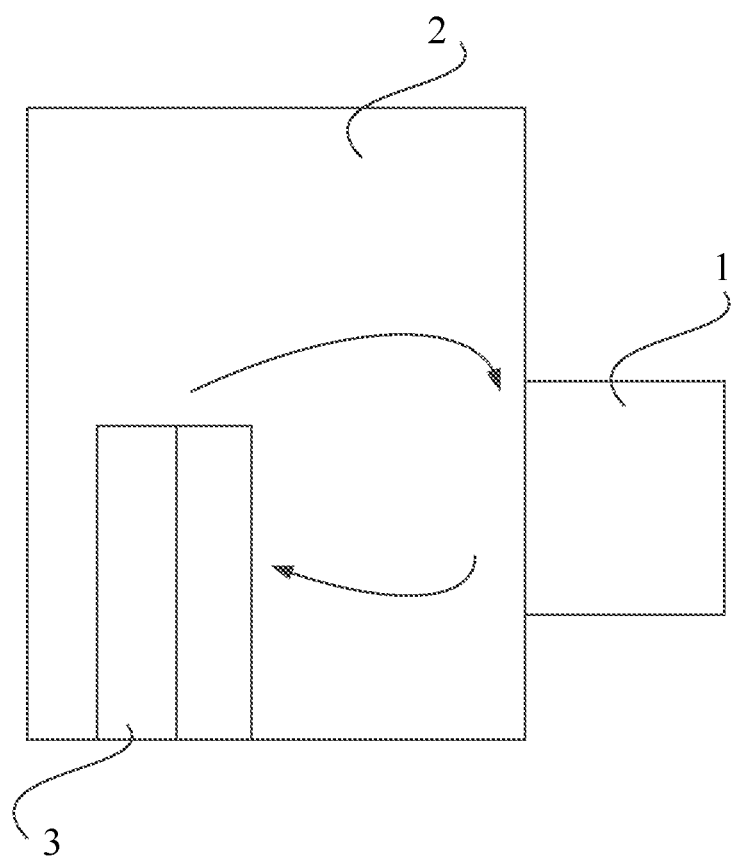
FIG. 1 is a schematic application diagram of refrigeration devices in conventional technologies.
Figure 2:
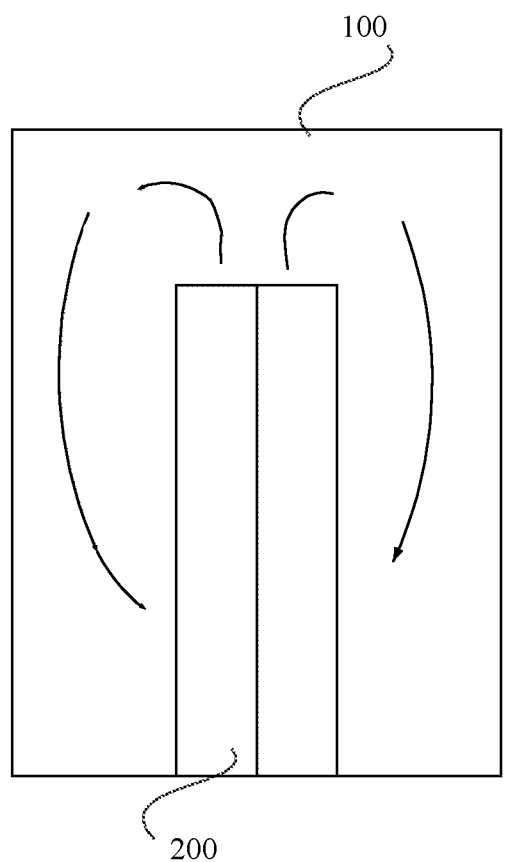
FIG. 2 is a schematic diagram of a structure of a top-exhaust mechanism.

FIG. 2 shows a ventilation manner of a top-exhaust cabinet 200. Solid-line arrows in FIG. 2 show an example of air flow directions during heat dissipation of the top-exhaust cabinet 200. An air intake vent of the top-exhaust cabinet 200 is disposed on one side of the cabinet, and an air exhaust vent of the cabinet is disposed on the top of the cabinet. During heat dissipation, air enters the cabinet from the one side of the cabinet and flows out from the top of the cabinet. When top-exhaust cabinets 200 are disposed in an equipment room 100, the top-exhaust cabinets 200 may be disposed side by side in a back-to-back manner.

Figure 3:
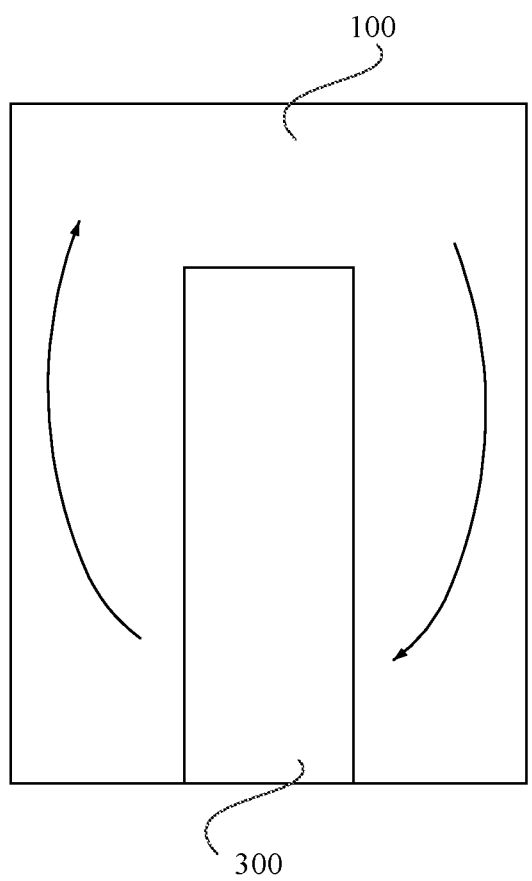
FIG. 3 is a schematic diagram of a structure of a side-exhaust mechanism.

FIG. 3 shows a ventilation manner of a side-exhaust cabinet. Solid-line arrows in FIG. 3 show an example of air flow directions during heat dissipation of the side-exhaust cabinet 300. An air intake vent and an air exhaust vent of the side-exhaust cabinet 300 are disposed on two opposite sides of the cabinet. During heat dissipation, air enters the cabinet from one side of the cabinet and flows out from a side opposite the side. If side-exhaust cabinets 300 are disposed in an equipment room 100, the cabinets need to be arranged in a single row, to avoid blocking of an air exhaust vent.

During cabinet disposition in an existing equipment room, the top-exhaust cabinet 200 shown in FIG. 2 may be disposed, and the side-exhaust cabinet 300 shown in FIG. 3 may also be disposed. However, a refrigeration device in conventional technologies cannot adapt to the foregoing two types of cabinets at the same time. Therefore, the embodiments of this disclosure provide a refrigeration device that can change an air intake manner, to adapt to cabinets with the foregoing two different hot air exhausting manners. The following provides descriptions with reference to specific views.

Figure 4:
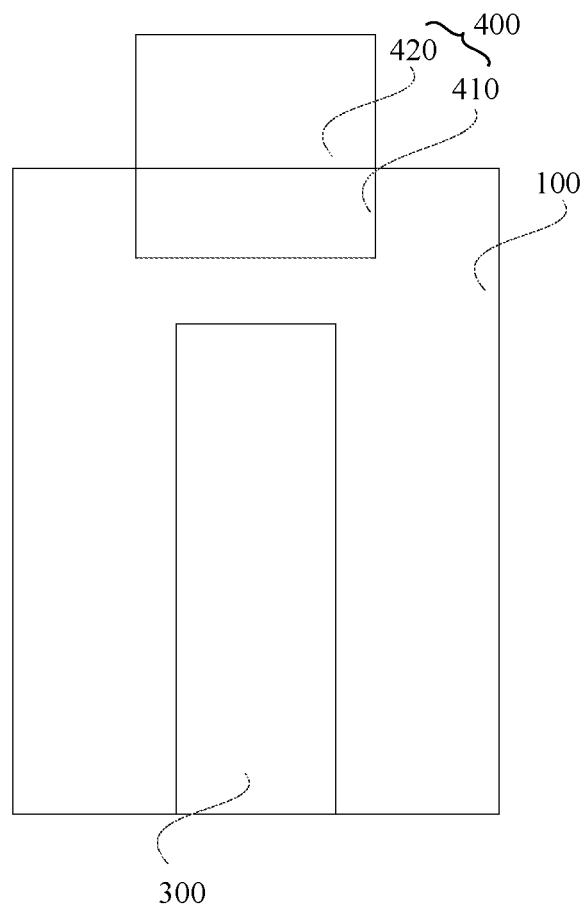
FIG. 4 is a schematic diagram of an application scenario of a refrigeration device according to an embodiment of this disclosure.

FIG. 4 is a schematic diagram of an application scenario of a refrigeration device 400 according to an embodiment of this disclosure. The refrigeration device 400 is disposed on a top plate of an equipment room 100. The refrigeration device 400 includes an indoor unit 410 and an outdoor unit 420. The indoor unit 410 is fixed to the top plate of the equipment room 100 and is located inside the equipment room 100. The outdoor unit 420 is fixed to the top plate of the equipment room 100 and is located outside the equipment room 100. When working, the indoor unit 410 performs heat exchange with a cabinet (using the side-exhaust cabinet 300 as an example), to take away heat produced by the cabinet. The outdoor unit 420 performs heat exchange with the indoor unit 410, and transfers heat of the indoor unit 410 out of the equipment room 100, to dissipate heat for the cabinet 300.

Figure 5:
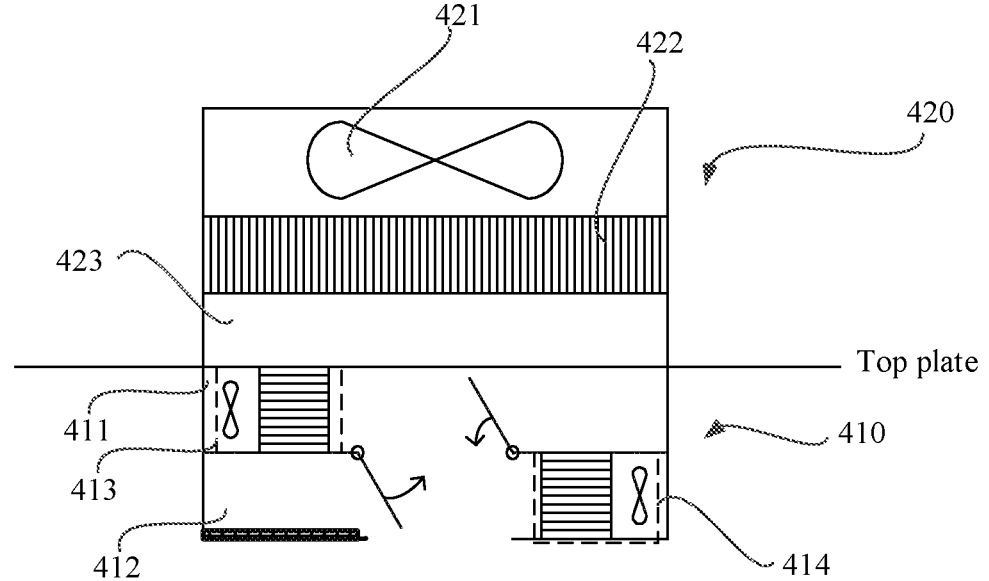
FIG. 5 is a schematic diagram of a structure of a refrigeration device according to an embodiment of this disclosure.

FIG. 5 is a schematic diagram of a structure of a refrigeration device according to an embodiment of this disclosure. For ease of description, a top plate of an equipment room is introduced as a reference plane, to describe the refrigeration device.

An outdoor unit 420 includes a condenser 422 and a fan 421. The fan 421 and the condenser 422 are disposed in a stacked manner. An air intake channel 423 is disposed below the condenser 422. The fan 421 drives air to flow through the air intake channel 423 into the condenser 422 for heat exchange.

An indoor unit 410 includes ventilation ducts and evaporation assemblies. The ventilation ducts include a first ventilation duct 411 and a second ventilation duct 412. The evaporation assemblies include a first evaporation assembly 413 and a second evaporation assembly 414. The first evaporation assembly 413 is disposed in the first ventilation duct 411, and the second evaporation assembly 414 is disposed in the second ventilation duct 412.

Figure 6:
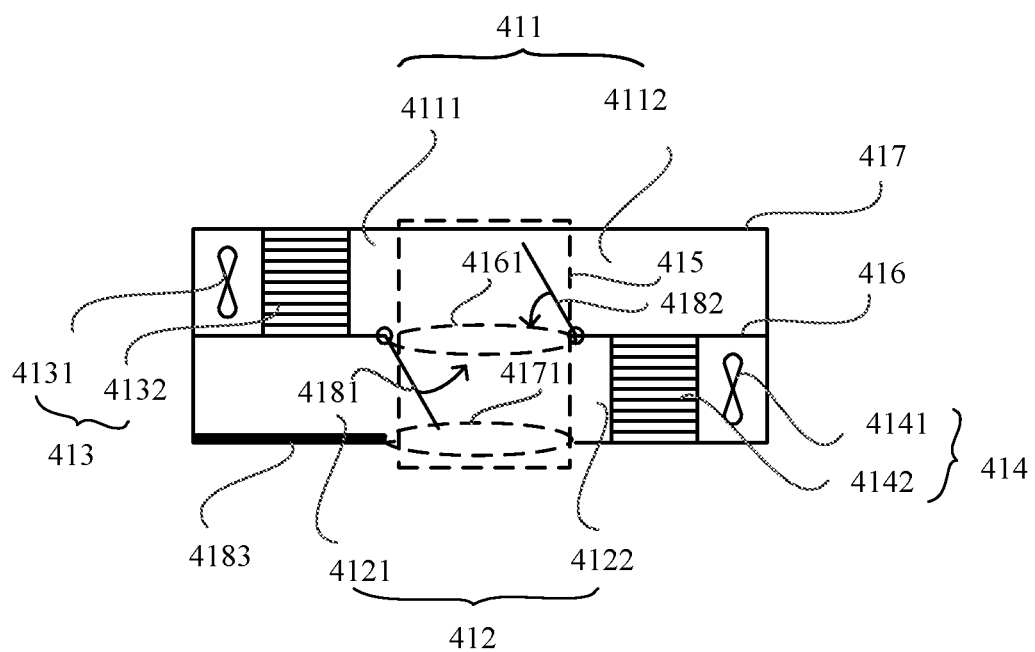
FIG. 6 is a schematic diagram of a structure of an indoor unit according to an embodiment of this disclosure.

FIG. 6 is a schematic diagram of a structure of an indoor unit. The indoor unit includes a housing 417. The housing 417 has a cavity extending along a first direction. In addition, two end portions of the housing 417 in the first direction have openings, so that the cavity communicates with the outside of the housing 417, and ventilation ducts are formed. The first direction is a direction parallel to or approximately parallel to a top plate of an equipment room.

A partition board 416 is disposed in the housing 417. The partition board 416 divides the cavity into a first ventilation duct 411 and a second ventilation duct 412. The first ventilation duct 411 and the second ventilation duct 412 are disposed along a second direction. The second direction is a direction perpendicular to the top plate of the equipment room, and the first direction is perpendicular to the second direction. A first ventilation opening 4161 is disposed on the partition board 416. The first ventilation duct 411 and the second ventilation duct 412 communicate with each other through the first ventilation opening 4161.

A manner of connection between the partition board 416 and the housing 417 is not limited in this disclosure. The partition board 416 and the housing 417 may be of an integrated structure. Alternatively, the partition board 416 is fixedly connected to the housing 417 by using a connecting piece (a bolt, a screw, a rivet, or the like). Alternatively, the partition board 416 is fixedly connected to the housing 417 through welding or clamping.

The housing 417 has a first side wall facing a cabinet. A second ventilation opening 4171 is disposed on the first side wall. The second ventilation opening 4171 is close to the second ventilation duct 412. Refer to FIG. 6. It can be seen that the second ventilation opening 4171 and the first ventilation opening 4161 are stacked along the second direction. For ease of description, a channel through which the first ventilation opening 4161 communicates with the second ventilation opening 4171 is referred to as a third ventilation duct 415. The third ventilation duct 415 extends along the second direction. Both the first ventilation opening 4161 and the second ventilation opening 4171 are located in the third ventilation duct 415, and the second ventilation opening 4171 serves as an air intake vent of the third ventilation duct 415.

It should be understood that, in this embodiment of this disclosure, opening areas and shapes of the first ventilation opening 4161 and the second ventilation opening 4171 are not limited, and the shapes and opening areas of the two ventilation openings may be the same or may be different. For example, both the first ventilation opening 4161 and the second ventilation opening 4171 may be round, rectangular, or the like, or the first ventilation opening 4161 is round and the second ventilation opening 4171 is rectangular.

The third ventilation duct 415 penetrates the first ventilation duct 411 and the second ventilation duct 412, and connects the first ventilation duct 411 to the second ventilation duct 412. It can be seen from FIG. 6 that the first ventilation duct 411 and the second ventilation duct 412 extend along the first direction, and the third ventilation duct 415 extends along the second direction, so that a "T"-shaped arrangement pattern is formed. The first ventilation duct 411 is divided into a first subchannel 4111 and a second subchannel 4112 by the third ventilation duct 415. The second ventilation duct 412 is divided into a third subchannel 4121 and a fourth subchannel 4122 by the third ventilation duct 415. The first subchannel 4111 and the third subchannel 4121 are located on one side of the third ventilation duct 415. The second subchannel 4112 and the fourth subchannel 4122 are located on another side of the third ventilation duct 415. The first subchannel 4111 and the fourth subchannel 4122 are respectively disposed on two opposite sides of the third ventilation duct 415, and are diagonally arranged.

The indoor unit further includes a first evaporation assembly 413 and a second evaporation assembly 414 that are used for heat exchange with the cabinet. The first evaporation assembly 413 is disposed in the first ventilation duct 411. The second evaporation assembly 414 is disposed in the second ventilation duct 412. When the first ventilation duct 411 and the second ventilation duct 412 are divided into different subchannels by the third ventilation duct 415, the first evaporation assembly 413 and the second evaporation assembly 414 are located on two opposite sides of the third ventilation duct 415, and are diagonally disposed. Further, the first evaporation assembly 413 is located in the first subchannel 4111, and the second evaporation assembly 414 is located in the fourth subchannel 4122.

For example, the first evaporation assembly 413 includes a first evaporator 4132 and a first fan 4131 that are disposed side by side, and the first evaporator 4132 and the first fan 4131 are arranged along the first direction. A placement direction of the first evaporation assembly 413 shown in FIG. 6 is used as a reference direction, and the first fan 4131 is located to the left of the first evaporator 4132. However, relative positions of the first evaporator 4132 and the first fan 4131 are not limited in this disclosure. The first fan 4131 may be alternatively located to the right of the first evaporator 4132.

The second evaporation assembly 414 includes a second evaporator 4142 and a second fan 4141 that are disposed side by side. For an arrangement direction of the second evaporator 4142 and the second fan 4141, refer to an arrangement direction of the first evaporator 4132 and the first fan 4131. Details are not described herein again.

The indoor unit further includes a baffle assembly. The baffle assembly is configured to adjust ventilation directions of the first ventilation duct 411 and the second ventilation duct 412, to adapt to the two different types of cabinets shown in FIG. 2 and FIG. 3. The baffle assembly includes a first baffle 4181, a second baffle 4182, and a third baffle 4183. To adapt to different types of cabinets, communication manners of the first ventilation duct 411, the second ventilation duct 412, and the third ventilation duct 415 are changed through cooperation among the first baffle 4181, the second baffle 4182, and the third baffle 4183, to implement air intake in different directions. The following describes the three baffles one by one.

The first baffle 4181 is connected to a first side wall of the first ventilation opening 4161 in a rotatable manner, and the second baffle 4182 is connected to a second side wall of the first ventilation opening 4161 in a rotatable manner. The first side wall of the first ventilation opening 4161 is a side wall, of the first ventilation opening 4161, close to the first subchannel 4111. The second side wall is a side wall, of the first ventilation opening 4161, close to the second subchannel 4112. The first side wall and the second side wall are oppositely disposed. When the first baffle 4181 and the second baffle 4182 rotate relative to the first ventilation opening 4161, the first baffle 4181 rotates toward the inside of the second ventilation duct 412, and the second baffle 4182 rotates toward the inside of the first ventilation duct 411. When the foregoing structure is used, the first baffle 4181 and the second baffle 4182 may be equivalent to leaves of a double door, and the first ventilation opening 4161 may be equivalent to a door frame. When the first baffle 4181 and the second baffle 4182 rotate relative to the first ventilation opening 4161, an action similar to door leaf opening/closing is formed, and the first ventilation opening 4161 is opened or closed through rotation of the first baffle 4181 and the second baffle 4182.

Different driving structures may be used to drive the first baffle 4181 to rotate. The baffle assembly further includes a first driving mechanism for driving the first baffle 4181 to rotate and be locked in a specified position. For example, the first driving mechanism may be a stepper motor. The stepper motor may drive the first baffle 4181 to rotate, and lock the first baffle 4181 after the rotation stops. It should be understood that the stepper motor is merely a driving mechanism used as a specific example, and another driving mechanism may be alternatively used to drive the first baffle 4181 to rotate. The second baffle 4182 may be driven in a same manner as the first baffle 4181. The baffle assembly further includes a second driving mechanism for driving the second baffle 4182 to rotate and be locked in a specified position. For details, refer to the descriptions of the first driving mechanism. Details are not described herein again.

The third baffle 4183 is configured to block the second ventilation opening 4171. Referring to the structure shown in FIG. 6, the third baffle 4183 is connected to the first side wall of the housing 417 in a slidable manner. The first side wall is a side wall that faces the cabinet after the indoor unit is installed in the equipment room. The third baffle 4183 is connected to the first sidewall of the housing 417 in a slidable manner, and is configured to block or open the second ventilation opening 4171.

The third baffle 4183 is driven by using a third driving mechanism. The third driving mechanism may be implemented through cooperation between a linear motor, a drive motor, and a transmission assembly. The transmission assembly may be a common transmission assembly such as a gear rack assembly, a lead screw assembly, or a transmission belt assembly.

When the first baffle 4181, the second baffle 4182, and the third baffle 4183 are in different specified positions, the baffle assembly is correspondingly in different states, and a ventilation direction of the indoor unit is also in different states. The following describes cooperation among the first baffle 4181, the second baffle 4182, and the third baffle 4183 in detail with reference to specific accompanying drawings.

Figure 7:
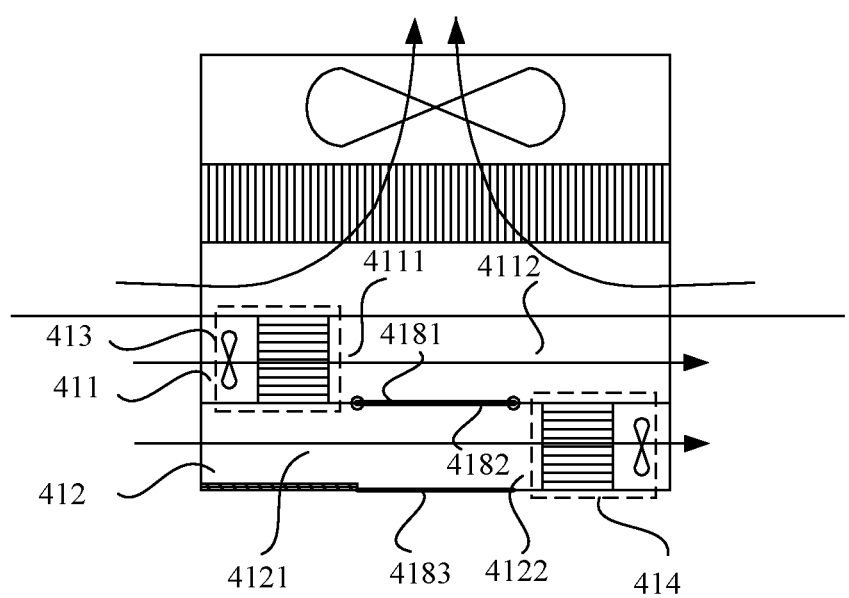
FIG. 7 is a schematic diagram of a structure of a refrigeration device in a first state according to an embodiment of this disclosure.

FIG. 7 is a schematic diagram of the baffle assembly in a first state. When the baffle assembly is in the first state, both the first baffle 4181 and the second baffle 4182 rotate to the first ventilation opening and block the first ventilation opening, and the third baffle 4183 blocks the second ventilation opening. For ease of description, a position of the first baffle 4181 is defined as a first specified position, a position of the second baffle 4182 is defined as a second specified position, and a position of the third baffle 4183 is defined as a fifth specified position.

When the first baffle 4181 is in the first specified position and the second baffle 4182 is in the second specified position, the first baffle 4181 and the second baffle 4182 isolate the first ventilation duct 411 from the second ventilation duct 412. The first subchannel 4111 and the second subchannel 4112 of the first ventilation duct 411 communicate with each other. The third subchannel 4121 and the fourth subchannel 4122 of the second ventilation duct 412 communicate with each other. The third ventilation duct is partitioned by the first baffle 4181 and the second baffle 4182, and the air intake vent (the second ventilation opening) of the third ventilation duct is shut off by the third baffle 4183.

Lines with arrowheads in FIG. 7 show air flow directions in the indoor unit. In the first ventilation duct 411, air flows in a direction from the first subchannel 4111 to the second subchannel 4112, and heat exchange is performed for the air by using the first evaporation assembly 413. In the second ventilation duct 412, air flows in a direction from the third subchannel 4121 to the fourth subchannel 4122, and heat dissipation is performed for the air by using the second evaporation assembly 414.

Figure 8:
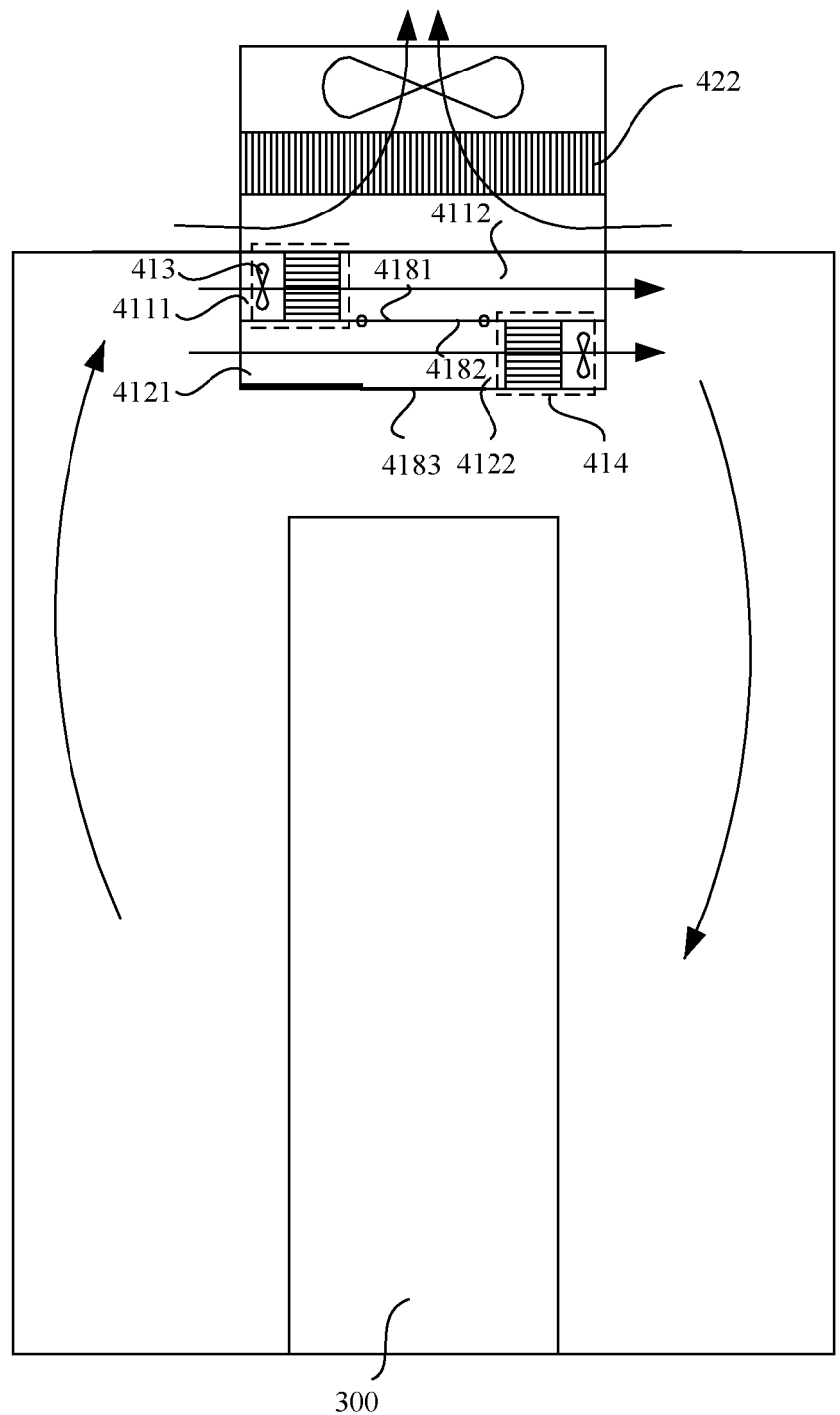
FIG. 8 is a schematic diagram of an application scenario of a refrigeration device in a first state according to an embodiment of this disclosure.

FIG. 8 is a schematic diagram of an application scenario of the indoor unit in the state shown in FIG. 7 in the equipment room. The refrigeration device in the state shown in FIG. 7 is applicable to the side-exhaust cabinet 300.

The first subchannel 4111 and the third subchannel 4121 are close to an air exhaust vent of the cabinet 300, and the second subchannel 4112 and the fourth subchannel 4122 are close to an air intake vent of the cabinet 300. During formation of an air cycle, cold air flows out from the second subchannel 4112 and the fourth subchannel 4122, and then flows into the air intake vent of the cabinet 300, the cold air exchanges heat with devices in the cabinet 300, formed hot air flows out of the air exhaust vent of the cabinet 300, and then flows into the first subchannel 4111 and the third subchannel 4121, and after heat exchange is performed for the hot air by using the first evaporation assembly 413 and the second evaporation assembly 414, cold air is formed. In this way, one air cycle is formed. The first evaporation assembly 413 and the second evaporation assembly 414 communicate with the condenser 422. Liquid flows in a loop formed by the condenser 422 and the evaporators (the first evaporation assembly 413 and the second evaporation assembly 414). High-temperature liquid in the first evaporation assembly 413 and the second evaporation assembly 414 flows into the condenser 422, and exchanges heat with air outside the equipment room to form cold liquid. The cold liquid flows back into the first evaporation assembly 413 and the second evaporation assembly 414. In this way, one liquid cycle is formed.

Figure 9:
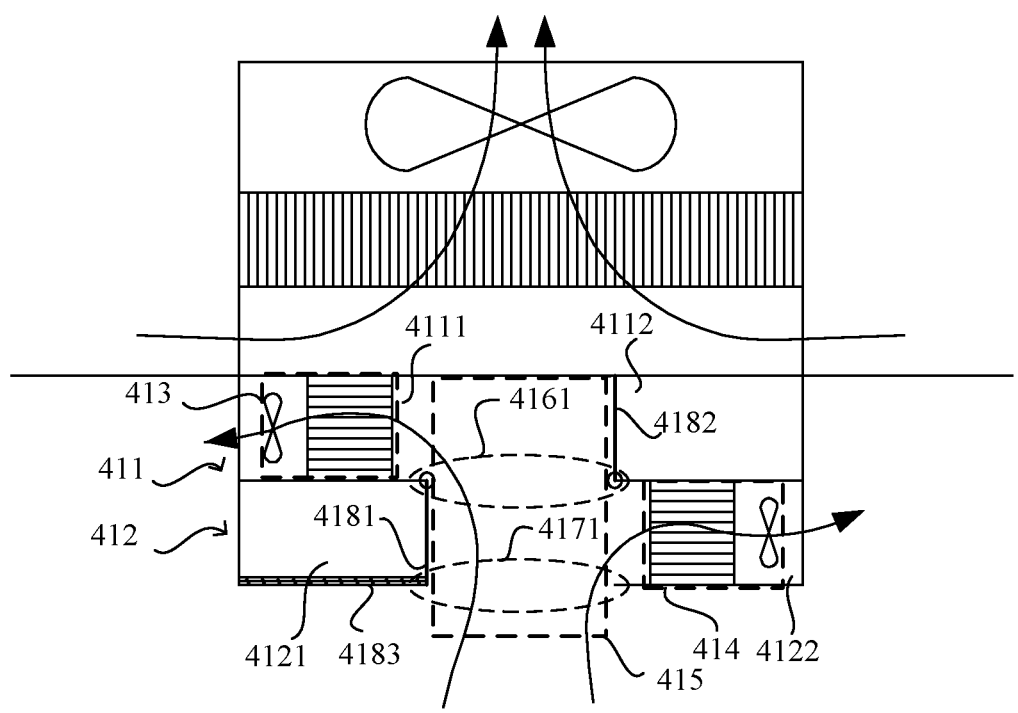
FIG. 9 is a schematic diagram of a structure of a refrigeration device in a second state according to an embodiment of this disclosure.

FIG. 9 is a schematic diagram of the baffle assembly in a second state. When the baffle assembly is in the second state, the first baffle 4181 and the second baffle 4182 rotate relative to the first ventilation opening 4161 to an open state, so that the first ventilation opening 4161 is open. The first baffle 4181 rotates to a position so that the third subchannel 4121 is blocked, to separate the third subchannel 4121 from the third ventilation duct 415. The second baffle 4182 rotates to a position so that the second subchannel 4112 is blocked, to separate the second subchannel 4112 from the third ventilation duct 415. In the second state, the third ventilation duct 415 communicates with the first subchannel 4111, and the third ventilation duct 415 communicates with the fourth subchannel 4122. In addition, the third baffle 4183 unblocks the second ventilation opening 4171, so that the second ventilation opening 4171 is connected to the second ventilation duct 412. For ease of description, the position of the first baffle 4181 is defined as a third specified position, the position of the second baffle 4182 is defined as a fourth specified position, and a position of the third baffle 4183 is defined as a sixth specified position.

Lines with arrowheads in FIG. 9 show an example of air flow directions in the indoor unit. The second ventilation opening 4171 is used as an air intake vent of the indoor unit. Air enters the third ventilation duct 415 from the second ventilation opening 4171, and then the air is divided. A part of the air enters the fourth subchannel 4122, and exchanges heat by using the second evaporation assembly 414. Cooled air flows out of a port of the fourth subchannel 4122 facing away from the third ventilation duct 415. Another part of the air enters the first subchannel 4111, and exchanges heat by using the first evaporation assembly 413. Cooled air flows out of a port of the first subchannel 4111 facing away from the third ventilation duct 415. From arrows shown in FIG. 9, it can be seen that air may flow out separately in two opposite directions when flowing out of the indoor unit.

Figure 10:
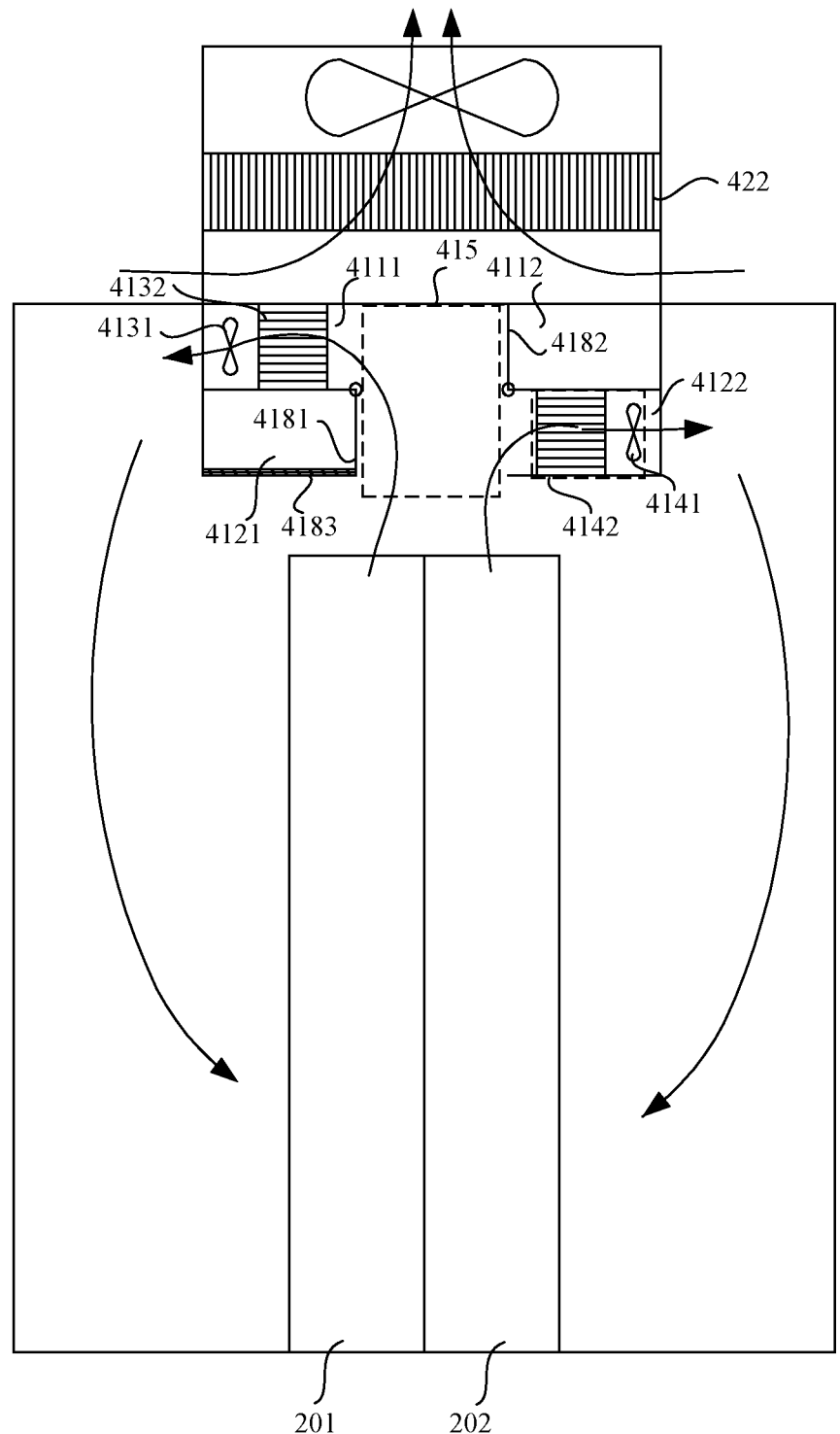
FIG. 10 is a schematic diagram of an application scenario of a refrigeration device in a second state according to an embodiment of this disclosure.

FIG. 10 is a schematic diagram of an application scenario of the indoor unit in the state shown in FIG. 9 in the equipment room. The refrigeration device in the state shown in FIG. 9 is applicable to top-exhaust cabinets, and the top-exhaust cabinets are arranged side by side. The second ventilation opening of the indoor unit faces air exhaust vents located at the tops of the two cabinets. For ease of description, the two cabinets are respectively referred to as a first cabinet 201 and a second cabinet 202. During formation of an air cycle, hot air flowing out of the air exhaust vents at the tops of the first cabinet 201 and the second cabinet 202 enters the third ventilation duct 415 through the second ventilation opening, the first fan 4131 draws air to a side of the first subchannel 4111 facing away from the third ventilation duct 415, and a part of the hot air is drawn into the first evaporator 4132 for heat exchange, and cold air obtained through heat exchange flows out of the first subchannel 4111, and the cold air flows into the first cabinet 201. In this way, one air cycle is formed. Another part of the hot air enters the third ventilation duct 415 through the second ventilation opening, the second fan 4141 draws air to a side of the fourth subchannel 4122 facing away from the third ventilation duct 415, and the hot air is drawn into the second evaporator 4142 for heat exchange, and cold air obtained through heat exchange flows out of the fourth subchannel 4122, and the cold air flows into the second cabinet 202. In this way, one air cycle is formed. For manners of heat exchange of the first evaporator 4132 and the second evaporator 4142 with the condenser 422, refer to related descriptions in FIG. 8. Details are not described herein again.

It can be seen from FIG. 8 and FIG. 10 that the refrigeration device provided in the embodiments of this disclosure may be applied to different scenarios. During heat dissipation for cabinets with different hot air exhausting manners, the refrigeration device may select different states for the baffle assembly based on the hot air exhausting manners of the cabinets. When the cabinet in the equipment room is changed from the cabinet shown in FIG. 8 to the cabinet shown in FIG. 10, a state of the baffle assembly may be changed from the first state to the second state, to change a ventilation manner of the indoor unit. Further, the first baffle rotates from the first specified position to the third specified position, the second baffle rotates from the second specified position to the fourth specified position, and the third baffle slides from the fifth specified position to the sixth specified position. In this way, the ventilation ducts of the indoor unit form a pattern of letting in cold air from the middle that connects the ducts at the tops of the first cabinet 201 and the second cabinet 202, and exhausting hot air from two sides. In addition, a rotation direction of the first fan is changed, so that an air exhaust direction of the first fan changes from a direction approaching the first evaporator to a direction leaving the first evaporator. A rotation direction of the second fan remains an original direction. Similarly, when the cabinet in the equipment room is changed from the cabinet shown in FIG. 10 to the cabinet shown in FIG. 8, a state of the baffle assembly may be changed from the second state to the first state, so as to adapt to a ventilation manner of the cabinet shown in FIG. 8. Details are not described herein again.

It should be understood that, in a rotation process of the first baffle, the first driving mechanism may drive the first baffle to rotate, and may lock the first baffle in the first specified position or the third specified position, in a rotation process of the second baffle, the second driving mechanism may drive the second baffle to rotate, and may lock the second baffle in the second specified position or the fourth specified position, and in a sliding process of the third baffle, the third driving mechanism may lock the third baffle in the fifth specified position or the sixth specified position.

For ease of controlling the first fan and the second fan, the refrigeration device provided in the embodiments of this disclosure may further include a controller (not shown), and the controller is configured to control rotation directions of the first fan and the second fan. For example, in the first state, the controller controls the first fan and the second fan to separately supply air in a same direction. As shown in FIG. 8, both the first fan and the second fan supply air in a direction from the first subchannel to the second subchannel. In the second state, the controller controls the first fan and the second fan to supply air in opposite directions. As shown in FIG. 10, the first fan supplies air in a direction from the second subchannel to the first subchannel, and the second fan supplies air in a direction from the first subchannel to the second subchannel. In this way, the first fan and the second fan can match a disposition manner of the ventilation ducts of the indoor unit.

In a solution, the controller may further control the first driving mechanism, the second driving mechanism, and the third driving mechanism, so that linkage is implemented among the first baffle, the second baffle, and the third baffle. For example, when the baffle assembly needs to be in the first state, a control instruction may be issued by using the controller, to control the first driving mechanism to drive the first baffle to rotate to the first specified position and lock the first baffle, control the second driving mechanism to drive the second baffle to rotate to the second specified position and lock the second baffle, and control the third driving mechanism to drive the third baffle to slide to the fifth specified position and lock the third baffle. Similarly, when the baffle assembly needs to be in the second state, control may also be implemented by using an instruction issued by the controller. It should be understood that the controller may be a conventional industrial computer, a programmable logic controller (PLC), or a single-chip microcomputer, and a control component of the controller performs a corresponding action in a conventional control manner. Details are not described herein.

It can be learned from the foregoing descriptions that, in the refrigeration device provided in the embodiments of this disclosure, in the first state, the baffle assembly separates the first ventilation duct from the second ventilation duct, and adjusts the first ventilation duct and the second ventilation duct to supply air in a same direction, so that the refrigeration device is applicable to a side-exhaust cabinet, and in the second state, the baffle assembly adjusts the first ventilation duct and the second ventilation duct to separately let in air from the middles, and the first ventilation duct and the second ventilation duct to supply air in opposite directions, so that the refrigeration device is applicable to a top-exhaust cabinet. The refrigeration device is adjusted to be in different states, thereby improving applicability of the refrigeration device.

Figure 11:
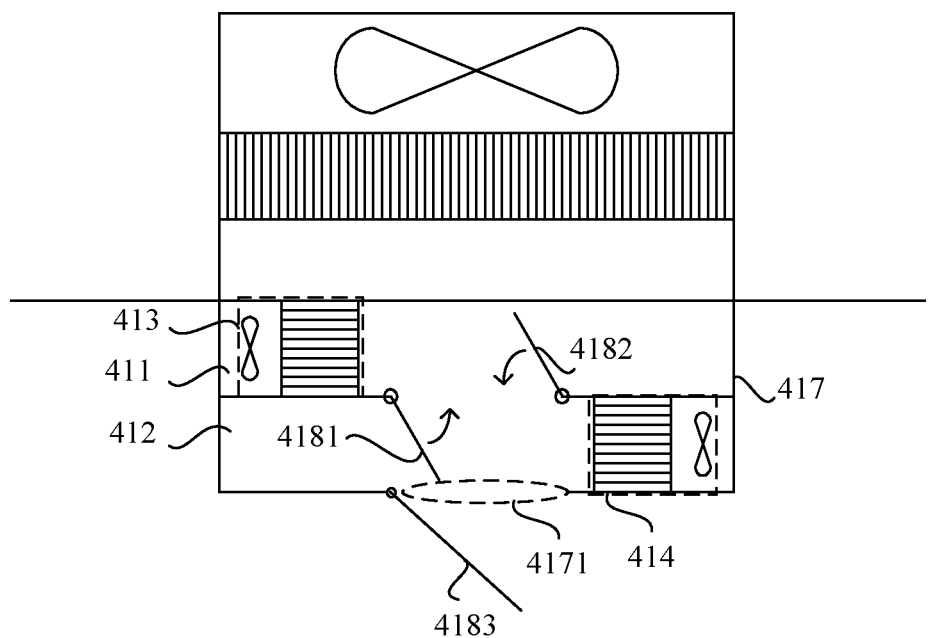
FIG. 11 is a schematic diagram of another refrigeration device according to an embodiment of this disclosure.

FIG. 11 shows a variant structure that is based on the refrigeration device shown in FIG. 5. For some of reference signs in FIG. 11, refer to the same reference signs in FIG. 5. Based on the refrigeration device shown in FIG. 5, the refrigeration device provided in this embodiment of this disclosure may alternatively control opening or closing of the second ventilation opening 4171 in a manner of connecting the third baffle 4183 to the first side wall of the housing 417 in a rotatable manner.

For example, when the baffle assembly is in the first state, the third baffle 4183 rotates to a seventh specified position, where the seventh specified position is a position in which the third baffle 4183 blocks the second ventilation opening 4171, and when the baffle assembly is in the second state, the third baffle 4183 rotates to an eighth specified position, where the eighth specified position is a position in which the third baffle 4183 avoids the second ventilation opening 4171, and in this state, the third baffle 4183 unblocks the second ventilation opening 4171, so that the second ventilation opening 4171 is open. During rotation of the third baffle 4183, a same driving mechanism as that of the first baffle 4181 and the second baffle 4182 may be used, and details are not described herein again.

With reference to FIG. 5 and FIG. 11, it can be learned that, in this embodiment of this disclosure, a specific moving manner of the third baffle 4183 is not limited, provided that the third baffle 4183 is connected to the first side wall of the housing 417 and can be used for blocking the second ventilation opening. In addition to the connection manners shown in FIG. 5 and FIG. 11, the third baffle 4183 may be connected to the first side wall of the housing 417 in other manners, which are not enumerated herein.

Figure 12:
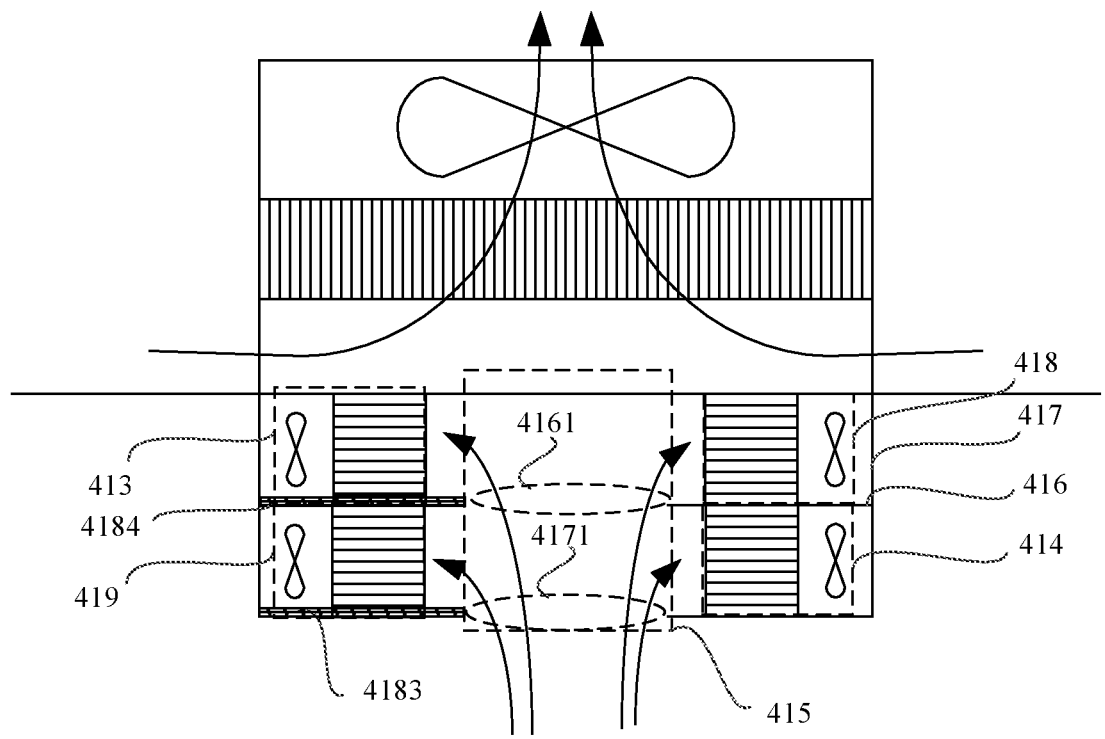
FIG. 12 is a schematic diagram of a structure of another refrigeration device in a first state according to an embodiment of this disclosure.
Figure 13:
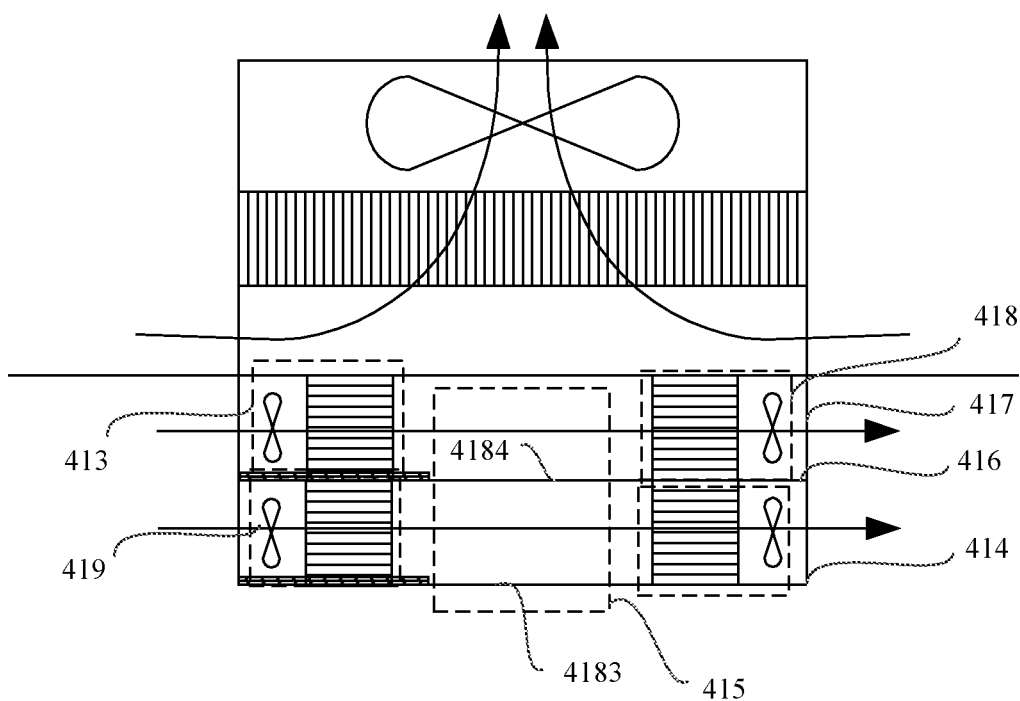
FIG. 13 is a schematic diagram of a structure of another refrigeration device in a second state according to an embodiment of this disclosure.

FIG. 12 and FIG. 13 show another variant structure that is based on the refrigeration device shown in FIG. 5. For some of reference signs in FIG. 12 and FIG. 13, refer to the same reference signs shown in FIG. 5.

FIG. 12 shows a state in which the refrigeration device is applicable to a top-exhaust cabinet. The refrigeration device shown in FIG. 12 includes a plurality of evaporation assemblies. A first evaporation assembly 413 and a third evaporation assembly 418 are disposed in a first ventilation duct 411, and the first evaporation assembly 413 and the third evaporation assembly 418 are respectively disposed on two sides of a first ventilation opening 4161. A fourth evaporation assembly 419 and a second evaporation assembly 414 are disposed in a second ventilation duct 412, and the second evaporation assembly 414 and the fourth evaporation assembly 419 are respectively disposed on two sides of the first ventilation opening 4171.

A baffle assembly includes a third baffle 4183 and a fourth baffle 4184. The fourth baffle 4184 is connected to a partition board 416 in a slidable manner, and the third baffle 4183 is connected to a first side wall of a housing 417 in a slidable manner. A fourth driving mechanism drives the fourth baffle 4184 to slide. The fourth driving mechanism may be the same as the foregoing third driving mechanism, and details are not described herein again.

In a second state, the fourth driving mechanism drives the fourth baffle 4184 to be located in a position for avoiding the first ventilation opening 4161, and the third driving mechanism drives the third baffle 4183 to be located in a position for avoiding the second ventilation opening 4171, so that both the first ventilation opening 4161 and the second ventilation opening 4171 are open. When air flows, ventilation directions of the first evaporation assembly 413 and the third evaporation assembly 418 are opposite, ventilation directions of the fourth evaporation assembly 419 and the second evaporation assembly 414 are opposite, and a ventilation direction of the first evaporation assembly 413 is the same as that of the fourth evaporation assembly 419. Referring to directions indicated by arrows shown in FIG. 12, after entering through the second ventilation opening 4171, air may be exhausted from two sides of an indoor unit. The refrigeration device in this state may be applied to a top-exhaust cabinet.

FIG. 13 shows a state in which the refrigeration device is applicable to a side-exhaust cabinet. The first ventilation opening is blocked by the fourth baffle 4184, and the second ventilation opening is blocked by the third baffle 4183. In this state, the fourth driving mechanism drives the fourth baffle 4184 to block the first ventilation opening 4161, and the third driving mechanism drives the third baffle 4183 to block the second ventilation opening 4171. During ventilation, as indicated by arrow directions shown in FIG. 13, a ventilation direction of the first evaporation assembly 413 is the same as that of the third evaporation assembly 418, and a ventilation direction of the second evaporation assembly 414 is the same as that of the fourth evaporation assembly 419. In the state shown in FIG. 13, the refrigeration device may be applied to a side-exhaust cabinet.

In the refrigeration device shown in FIG. 12 and FIG. 13, although a quantity of evaporation assemblies is increased, a quantity of moving components for changing a ventilation manner of the refrigeration device is decreased (a quantity of baffles is decreased), thereby improving reliability of the refrigeration device during use.

An embodiment of this disclosure further provides a data center. The data center includes an equipment room and cabinets disposed in the equipment room, and further includes the refrigeration device configured to dissipate heat for the cabinets according to any one of the foregoing embodiments. The refrigeration device is disposed on the top of the equipment room, and is located above the cabinets. In the foregoing technical solution, ventilation ducts of the refrigeration device are reconfigured, and the baffle assembly is disposed to change an air intake manner of the ventilation duct, so that the refrigeration device can be applied to cabinets of different hot air exhausting types, thereby improving universality of the refrigeration device.

Refer to FIG. 8. The cabinet is a cabinet that lets in cold air from one side and exhausts hot air from another side, the cabinets are disposed in a single row, and the baffle assembly of the refrigeration device is in the first state, a ventilation direction of the first ventilation duct is the same as that of the second ventilation duct, and the ventilation direction of the first ventilation duct is the same as that of the cabinet. For details, refer to related descriptions of the refrigeration device in the first state.

Refer to FIG. 10. The cabinet is a side-intake top-exhaust cabinet, two of the cabinets are disposed side by side, and air intake sides of the two cabinets are disposed oppositely, and the baffle assembly is in the second state, the first ventilation duct and the second ventilation duct let in air from the middles, and an air intake direction of the first ventilation duct faces the tops of the two cabinets. For details, refer to related descriptions of the refrigeration device in the second state.

It is clear that a person skilled in the art can make various modifications and variations to this disclosure without departing from the spirit and scope of this disclosure. This disclosure is intended to cover these modifications and variations of this disclosure provided that they fall within the scope of the claims of this disclosure and equivalent technologies thereof.

What is claimed is:

1. A refrigeration device comprising:
   an indoor component comprising:
   a first ventilation duct and a second ventilation duct that are arranged along a same direction in relation to a top of a cabinet;
   a first ventilation opening comprising a first side and a second side, wherein the first ventilation duct and the second ventilation duct are configured to communicate with each other through the first ventilation opening;
   a first evaporation assembly disposed in the first ventilation duct and further disposed on the first side of the first ventilation opening;
   a second evaporation assembly disposed in the second ventilation duct and further disposed on the second side of the first ventilation opening;
   a baffle assembly configured to adjust air intake directions of the first ventilation duct and the second ventilation duct,
   wherein, in a first state, the baffle assembly is configured to:
   separate the first ventilation duct from the second ventilation duct; and
   adjust the first ventilation duct and the second ventilation duct to supply air in a same direction, and
   wherein, in a second state, the baffle assembly is further configured to adjust the first ventilation duct and the second ventilation duct to separately let in air from the top of the cabinet and to supply air in opposite directions; and
   an outdoor component coupled to the indoor component and comprising a condenser configured to separately perform heat exchange with each of the first evaporation assembly and the second evaporation assembly.

2. The refrigeration device of claim 1, wherein the indoor component further comprises a third ventilation duct configured to penetrate the first ventilation duct and the second ventilation duct and connect the first ventilation duct to the second ventilation duct, wherein the first ventilation opening is located in the third ventilation duct, wherein an air intake vent of the third ventilation duct is proximate to the second ventilation duct, wherein the first ventilation duct is divided into a first subchannel and a second subchannel by the third ventilation duct, wherein the second ventilation duct is divided into a third subchannel and a fourth subchannel by the third ventilation duct and, wherein the first subchannel is located on a third side of the third ventilation duct, wherein the fourth subchannel is located on a fourth side of the third ventilation duct, wherein the first evaporation assembly is located in the first subchannel, wherein the second evaporation assembly is located in the second subchannel, wherein, in the first state, the baffle assembly is further configured to:
couple the first subchannel to the second subchannel;
couple the second subchannel to the fourth subchannel; and
clock the air intake vent, and
wherein, in the second state, the baffle assembly is further configured to;
couple each of the first subchannel and the fourth subchannel to the third ventilation duct to enable the first subchannel and the fourth subchannel to let in air through the third ventilation duct; and
separate each of the second subchannel and the third subchannel from the third ventilation duct.

3. The refrigeration device of claim 2, wherein the indoor component further comprises a housing with two ends having openings, wherein a partition board is disposed in the housing, and configured to divide a cavity in the housing into the first ventilation duct and the second ventilation duct, wherein a second ventilation opening is disposed on a first side wall of the housing facing the cabinet, wherein the first ventilation opening is disposed on the partition board, wherein the second ventilation opening and the first ventilation opening communicate with each other and are located in the third ventilation duct, and wherein the second ventilation opening is the air intake vent.

4. The refrigeration device of claim 3, wherein the baffle assembly comprises;
a first baffle coupled to the partition board in a first rotatable manner;
a second baffle coupled to the partition board in a second rotatable manner; and
a third baffle coupled to the first side wall and configured to block the second ventilation opening,
wherein, in the first state, the first baffle is configured to rotate to a first position, the second baffle is configured to rotate to a second position, the first baffle and the second baffle are configured to block the first ventilation opening, the first subchannel is coupled to the second subchannel, the third subchannel is coupled to the fourth subchannel, and the third baffle is configured to block the second ventilation opening, and
wherein, in the second state, the first baffle is configured to rotate to a third position and separate the third subchannel from the third ventilation duct, the second baffle is configured to a fourth position and separate the second subchannel from the third ventilation duct, and the third baffle is configured unblock the second ventilation opening to open the second ventilation opening.

5. The refrigeration device of claim 4, wherein the baffle assembly further comprises:
a first driving mechanism configured to drive the first baffle to rotate and be locked in the first position or the third position; and
a second driving mechanism configured to drive the second baffle to rotate and be locked in the second position or the fourth position.

6. The refrigeration device of claim 5, wherein the third baffle is coupled to the first side wall in a slidable manner, wherein, in the first state, the third baffle is configured to slide to a fifth position and block the second ventilation opening, and wherein, in the second state, the third baffle is further configured to slide to a sixth position and open the second ventilation opening.

7. The refrigeration device of claim 5, wherein the third baffle is coupled to the first side wall in a rotatable manner, wherein, in the first state, the third baffle is configured to rotate to a seventh position and block the second ventilation opening, and wherein, in the second state, the third baffle is further configured to rotate to an eighth position and open the second ventilation opening.

8. The refrigeration device of claim 4, wherein the third baffle is coupled to the first side wall in a slidable manner, wherein, in the first state, the third baffle is configured to slide to a fifth position and block the second ventilation opening, and wherein, in the second state, the third baffle is further configured to slide to a sixth position and open the second ventilation opening.

9. The refrigeration device of claim 8, wherein the baffle assembly further comprises a third driving mechanism configured to drive the third baffle to slide and be locked in the fifth position or the sixth position.

10. The refrigeration device of claim 4, wherein the third baffle is coupled to the first side wall in a rotatable manner, wherein, in the first state, the third baffle is configured to rotate to a seventh position and block the second ventilation opening, and wherein, in the second state, the third baffle is further configured to rotate to an eighth position and open the second ventilation opening.

11. The refrigeration device of claim 1, wherein the first evaporation assembly comprises a first evaporator and a first fan that are disposed side by side, and wherein the second evaporation assembly comprises a second evaporator and a second fan that are disposed side by side.

12. The refrigeration device of claim 11, further comprises a controller configured to:
control the first fan and the second fan to separately supply air in a same direction in the first state; and
control the first fan and the second fan to supply air in opposite directions in the second state.

13. A data center comprising,
an equipment room comprising a first top;
cabinets disposed in the equipment room and comprising a second top; and
a refrigeration device disposed on the first top located above the cabinets, wherein the refrigeration device is configured to dissipate heat for the cabinets and comprising:
an indoor component comprising:
a first ventilation duct and a second ventilation duct that are arranged along a same direction in relation to the second top;
a first ventilation opening comprising a first side and a second side, wherein the first ventilation duct and the second ventilation duct are configured to communicate with each other through the first ventilation opening;
a first evaporation assembly disposed in the first ventilation duct and further disposed on the first side of the first ventilation opening;

a second evaporation assembly disposed in the second ventilation duct and further disposed on a second side of the first ventilation opening;

a baffle assembly configured to adjust air intake directions of the first ventilation duct and the second ventilation duct, wherein in a first state, the baffle assembly is configured to:

separate the first ventilation duct from the second ventilation duct; and adjust the first ventilation duct and the second ventilation duct to supply air in a same direction, and wherein, a second state, the baffle assembly is further configured to adjust the first ventilation duct and the second ventilation duct to separately let in air from the second top and to supply air in opposite directions; and an outdoor component coupled to the indoor component and comprising a condenser that is configured to separately performs heat exchange with each of the first evaporation assembly and the second evaporation assembly.

14. The data center of claim 13, wherein the cabinet is a side-intake top-exhaust cabinet, wherein two of the cabinets are disposed side by side, wherein air intake sides of the two cabinets are disposed oppositely, wherein the baffle assembly is in the second state, wherein the first ventilation duct and the second ventilation duct let in the air from the second top, and wherein an air intake direction of the first ventilation duct faces tops of the two cabinets.

15. The data center of claim 13, wherein the cabinet lets in cold air from one side and exhausts hot air from another side, wherein the cabinets are disposed in a single row, wherein the baffle assembly is in the first state, wherein a ventilation direction of the first ventilation duct is the same as that of the second ventilation duct, and wherein the ventilation direction of the first ventilation duct is the same as that of the cabinet.

16. The data center of claim 13, wherein the first evaporation assembly comprises a first evaporator and a first fan that are disposed side by side, and wherein the second evaporation assembly comprises a second evaporator and a second fan that are disposed side by side.

17. The data center of claim 16, wherein the refrigeration device comprises a controller configured to:

control the first fan and the second fan to separately supply air in a same direction in the first state; and control the first fan and the second fan to supply air in opposite directions in the second state.

18. The data center of claim 13, wherein the indoor component further comprises:

a third ventilation duct comprising an air intake vent; and a housing with two ends having openings, wherein a partition board is disposed in the housing to divide a cavity in the housing into the first ventilation duct and the second ventilation duct, wherein a second ventilation opening is disposed on a first side wall of the housing facing the cabinet, wherein the first ventilation opening is disposed on the partition board, wherein the second ventilation opening and the first ventilation opening communicate with each other and are located in the third ventilation duct, and wherein the second ventilation opening is the air intake vent.

19. The data center of claim 18, wherein the baffle assembly comprises:

a first baffle coupled to the partition board in a first rotatable manner;

a second baffle coupled to the partition board in a second rotatable manner; and a third baffle coupled to the first side wall and is configured to block the second ventilation opening.

20. The data center of claim 19, wherein, in the first state, the first baffle is configured to rotate to a first position, the second baffle is configured to rotate to a second position, the first baffle and the second baffle are configured to block the first ventilation opening, the first subchannel is coupled to the second subchannel, the third subchannel is coupled to the fourth subchannel, and the third baffle is configured to block the second ventilation opening, and wherein, in the second state, the first baffle is configured to rotate to a third position and separate the third subchannel from the third ventilation duct, the second baffle is configured to rotate to a fourth position and separate the second subchannel from the third ventilation duct, and the third baffle is configured to unblock the second ventilation opening to open the second ventilation opening.

* * * * *

UNITED STATES PATENT AND TRADEMARK OFFICE
CERTIFICATE OF CORRECTION

PATENT NO. : 11,839,063 B2
APPLICATION NO. : 17/570955
DATED : December 5, 2023
INVENTOR(S) : Qi Xuan It is certified that error appears in the above-identified patent and that said Letters Patent is hereby corrected as shown below:

In the Claims

Claim 2, Column 15, Line 19: "clock the air" should read "block the air"

Claim 4, Column 15, Line 59: "configured to a fourth" should read "configured to rotate to a fourth"

Claim 13, Column 17, Line 14: "wherein, a second state, the" should read "wherein, in a second state, the"

Claim 13, Column 17, Line 21: "rarely performs heat" should read "rarely perform heat"

Signed and Sealed this
Twenty-third Day of January, 2024

Katherine Kelly Vidal
*Director of the United States Patent and Trademark Office*